United States Patent
Ishizuki et al.

(10) Patent No.: US 6,943,447 B2
(45) Date of Patent: Sep. 13, 2005

(54) THIN FILM MULTI-LAYER WIRING SUBSTRATE HAVING A COAXIAL WIRING STRUCTURE IN AT LEAST ONE LAYER

(75) Inventors: Yoshikatsu Ishizuki, Kawasaki (JP); Nobuyuki Hayashi, Kawasaki (JP); Masataka Mizukoshi, Kawasaki (JP); Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 53 days.

(21) Appl. No.: 10/338,646

(22) Filed: Jan. 9, 2003

(65) Prior Publication Data

US 2004/0009666 A1 Jan. 15, 2004

(30) Foreign Application Priority Data

Jan. 10, 2002 (JP) .......................................... 2002-003046
Jan. 29, 2002 (JP) .......................................... 2002-020436

(51) Int. Cl.⁷ ............................................. H01L 21/31
(52) U.S. Cl. ....................... 257/758; 257/760; 257/774; 257/775; 257/776; 428/209; 428/210; 156/233; 156/234; 156/235

(58) Field of Search ............................ 257/758, 760, 257/774–776; 361/751–748; 156/233–235; 216/13, 38; 428/210–209

(56) References Cited

U.S. PATENT DOCUMENTS

5,439,732 A * 8/1995 Nagasaka et al. ........... 428/210
6,143,116 A * 11/2000 Hayashi et al. ............. 156/233
2002/0182958 A1 * 12/2002 Tani et al. ................... 442/180

FOREIGN PATENT DOCUMENTS

JP    08-181485 A    7/1996
JP    11-154675    6/1999

* cited by examiner

*Primary Examiner*—Dung A. Le
(74) *Attorney, Agent, or Firm*—Armstrong, Kratz, Quintos, Hanson & Brooks, LLP

(57) ABSTRACT

A thin film multi-layer wiring substrate comprising a plurality of wiring layers, each adjacent pair of wiring layers being separated by an insulating layer, wherein at least one of the wiring layers includes wiring formed by an inner conductor member and a conductor layer surrounding the periphery thereof through an insulating material.

7 Claims, 8 Drawing Sheets

THIN FILM MULTI-LAYER WIRING SUBSTRATE HAVING A COAXIAL WIRING STRUCTURE IN AT LEAST ONE LAYER

CROSS-REFERENCE TO RELATED APPLICATIONS

This application is based upon and claims the benefit of priority from the prior Japanese Patent Application Nos. 2002-3046 and 2002-20436, filed on Jan. 10 and Jan. 29, 2002, respectively, the entire contents of which are incorporated herein by reference.

BACKGROUND OF THE INVENTION

1. Field of the Invention

The present invention relates to a thin film multi-layer wiring substrate and, in particular, to a thin film multi-layer wiring substrate adapted for high frequency signal transmission, and to a method for manufacturing the same. The present invention also relates to a printed circuit board favorable for use in high frequency circuits.

2. Description of the Related Art

In the field of electronic machinery, high density mounting is advancing, and the signal speed of electronic machines is accelerating. Under such circumstances, noise reduction measures in signal transmission are becoming increasingly important.

As one type of noise reduction measure, formation of coaxial wiring in a thick film multi-layer printed circuit board is performed (Unexamined Patent Publication (Kokai) No. 4-267586).

In this coaxial wiring pattern formation method, after forming a lower conductive pattern by means of a thick film printing method or the like on the surface of a base substrate of alumina ceramics or the like, a light sensitive insulation film is formed thereon. After drying this insulation film, a via hole is formed in the insulation film by photolithography, and a conductive paste is introduced into the via hole and sintered to form a lateral conductor, whereafter a signal wiring pattern is formed on the insulation film by a thin film plating method. Then, by the same process, an insulating film, a via hole, and, by means of a conductive paste, a lateral conductor, are formed, whereafter an upper conductive pattern is formed to form the coaxial wiring structure.

In the method disclosed in Unexamined Patent Publication (Kokai) No. 4-267586, the gap between the signal wiring formed by the thick film printing method and the lateral conductor via hole formed by photolithography is set at approximately 100 micrometers in consideration of relative dislocation. This is because dislocation occurs when matching the via hole film to the previously formed conductive pattern, the cause of this dislocation being a film matching error, or alternatively, changes in the dimensions of the substrate, changes in the film dimensions, or the like.

Where the gap between the signal wiring and the lateral conductor is set at 100 micrometers in this way, the signal wiring pitch is limited to approximately 500 micrometers, it being problematic to set it any finer.

On the other hand, where transmitting a high frequency signal on a printed circuit board, it is easy for crosstalk to occur between signal line conductors, therefore various means for reducing this problem have been proposed.

To avoid crosstalk, electrical couplings between signal line conductors can be arranged sparingly; for example, a method of widening the gaps between signal line conductors, providing ground conductors in the vicinity of the signal line conductors, or the like is known.

As a printed circuit board structure based on the above method, using a strip line structure or micro strip line structure, sandwiching the circuit pattern layer of the signal line conductors between ground line pattern layers, is known, whereby the desired characteristic impedance can be realized and crosstalk reduced.

Also, the propagation characteristic of high frequency signals relies on the dielectric constant of the printed circuit board material and, therefore, in realizing a signal line conductor with little propagation loss, it is well known that a material with a low dielectric constant must be used.

In order to avoid crosstalk, where the method of widening the spaces between the signal line conductors is employed, this leads to the problem of reduced wiring density or signal transmission loss, and where the method of providing ground conductors between the signal line conductors is employed, although crosstalk between signal line conductors propagating the same signal is alleviated, prevention of crosstalk between signal line conductors propagating different signals is basically impossible.

Also, because there is no shield layer on the printed circuit board itself, it easily succumbs to the effect of extraneous noise and, in order to eliminate that effect, it is necessary to provide a conductive shielding case or the like to shield the printed circuit board.

Further, in recent years, in high frequency devices with clock frequencies in the order of gigahertz, although printed circuit board materials with dielectric constants in the order of 3, such as polyimide and the like, have been used, these printed circuit board materials are limited when it comes to further reducing the dielectric constant.

SUMMARY OF THE INVENTION

The object of the present invention is to provide a thin film multi-layer wiring substrate and a manufacturing method therefor, that can allow narrower spaces between signal wiring and lateral conductors, and realize high density mounting and high signal speeds.

Another object of the present invention is to realize, without changing the manufacturing method of the prior art, a printed circuit board that is suitable for use in circuits that handle high frequency signals, on which high frequency devices can be mounted at high densities, and that have no crosstalk.

The thin film multi-layer wiring substrate according to the present invention comprises a plurality of wiring layers, each adjacent pair of wiring layers being separated by an insulating layer, wherein at least one of the wiring layers includes wiring formed by an inner conductive member and a conductive layer surrounding the periphery of the inner conductive member through an insulating material.

The thin film multi-layer wiring substrate can be produced by a method for producing a thin film multi-layer wiring substrate having a predetermined number of wiring layers, each adjacent pair of wiring layers being separated by an insulating layer, at least one of the wiring layers including wiring formed by an inner conductive member and a conductive layer surrounding the periphery of the inner conductive member through an insulating material, by the formation of the insulating and wiring layers a predetermined member of times, the method comprising making the wiring formed by the inner conductive member and the conductive layer surrounding the periphery of the inner conductive member through an insulating material, by forming, on an insulating layer, a lower portion of the conductive layer surrounding the periphery of the inner conductive layer through an insulating material, forming, on the lower portion, lateral portions of the conductive layer surrounding the periphery of the inner conductive layer through an insulating material, at which time the inner conductive member is formed simultaneously with the formation of part of the lateral portions, and forming an upper portion of the conductive layer surrounding the periphery of the inner conductive layer through an insulating material.

In one aspect, the thin film multi-layer wiring substrate of the present invention can be produced by preparing wiring formed by an inner conductive member and a conductive layer surrounding the periphery of the inner conductive member through an insulating material, by the steps of forming a lower portion of the conductive layer on an insulating layer, forming side wall lower sections that are part of lateral portions of the conductive layer on the lower portion of the conductive layer, forming an insulating layer that covers the side surfaces and exposes the upper surfaces of the side wall lower sections, respectively forming side wall central sections which are part of the lateral portions of the conductive layer and an inner conductive member on the exposed upper surfaces of the side wall lower sections and an insulating layer in a central position of the side wall lower sections, forming a side wall upper sections which are part of the lateral portions of the conductive layer on the upper surfaces of the side wall central sections, forming an insulating layer that covers the inner conductive member and exposes the upper surfaces of the side wall upper sections, and forming, on the insulating layer, an upper portion of the conductive layer that connects to the exposed side wall upper sections.

In another aspect, the thin film multi-layer wiring substrate of the present invention can be produced by preparing wiring formed by an inner conductive member and a conductive layer surrounding the periphery of the inner conductive member through an insulating material, by the steps of forming a lower portion of the conductive layer on an insulating layer that forms a groove, forming side wall lower sections that are part of lateral portions of the conductive layer on the lower portion of the conductive layer, forming an insulating layer that covers the side surfaces and exposes the upper surfaces of the side wall lower sections, respectively forming side wall upper sections which are part of the lateral portions of the conductive layer and an inner conductive member on the exposed upper surfaces of the side wall lower sections and between the side wall lower sections, in a groove in the insulating layer formed covering the side surfaces of the side wall lower sections and following the shape of the groove in the underlying insulating layer, forming an insulating layer that covers the inner conductive member and exposes the upper surfaces of the side wall upper sections, and forming, on the insulating layer, an upper portion of the conductive layer that connects to the exposed side wall upper sections.

In the printed circuit board of the present invention, a coaxial structure in which a cavity is formed surrounding the upper surface and left and right side surfaces of a signal line conductor formed from metal, and a shield conductive layer in which openings formed having lengths and distances therebetween of one quarter wavelength or less are arranged above the cavity, is incorporated.

By forming the openings having lengths and distances therebetween of one quarter wavelength or less in the shield conductive layer, the impedance of the signal line conductor can be reduced, interference due to electromagnetic induction between signal lines prevented, electrostatic induction noise from outside reduced, and deterioration of the high frequency characteristic suppressed and, in addition, because the above coaxial structure allows convenient production by applying the prior art processing technique for producing prior art thin film multi-layer wiring substrates, it can be made to correspond easily to existing techniques.

DESCRIPTION OF THE PREFERRED EMBODIMENTS

In the thin film multi-layer wiring substrate of the present invention, at least one wiring layer comprises wiring of a coaxial structure, formed by an inner conductive member acting as a signal transmission member and a conductive layer surrounding the inner conductive member via an insulating material. The coaxial structure wiring may also exist in only one wiring layer or a plurality of wirings layers. Similarly, coaxial structure wiring can be combined with normal wiring without an outer conductor in one wiring layer. The wiring layer can be manufactured with a conductor of copper or copper alloy, aluminum or aluminum alloy, or the like. The wiring layer that includes the coaxial structure wiring, generally, can be buried in an insulating layer, and the wiring layer that does not include coaxial structure wiring can be buried in an insulating layer, or exposed above the insulating layer on the upper surface of the thin film multi-layer wiring substrate.

The insulating layer can be formed from a normal insulating material. For example, epoxy resin or polyimide resin can be used. Otherwise, polybenzooxazole resin, benzocyclobutene resin or the like can be used, these low dielectric constant materials being particularly advantageous in high frequency signal transmission.

The thin film multi-layer wiring substrate of the present invention will now be explained in more detail with reference to the drawings.

Figure 1A:
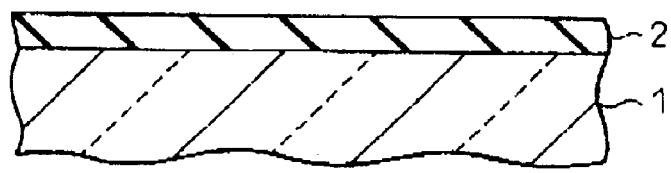
FIGS. 1A to 1I illustrate the processes of the thin film multi-layer wiring substrate production method of the present invention.

As shown in FIG. 1A, a Pyrex (trade name) glass base 1 is prepared, and after a chrome film (not shown) of 0.1 micrometer thickness is formed on the upper surface thereof, the chrome film is coated with a non-photosensitive polyimide resin by a spin coating method to a thickness of approximately 10 micrometers. As a coating method, other than the spin coating method, a screen printing method, spray method, curtain coating method, roller coating method, dipping method, or the like can be used. Subsequently, this resin film is dried at 80° C. for 30 minutes, whereafter the resin is hardened by heating at 350° C. for 30 minutes to form an insulating layer 2. As the base 1, it is also possible to use a rigid material other than glass. The above chrome film is provided to bond the insulating layer 2 to the glass material base 1, and a film of another effective material may be used instead to increase the adhesion of the insulating layer 2 to the base 1.

Figure 1B:
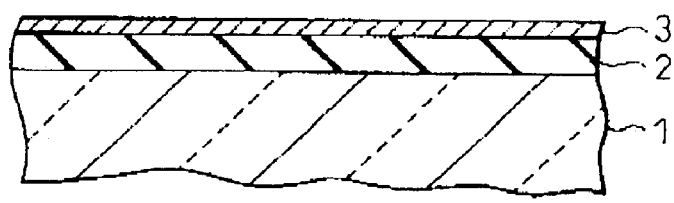

Subsequently, an electrode layer (not shown) is formed on the surface of the insulating layer 2, by a sputtering method, in order to subsequently perform electrolytic copper plating, whereafter the electrolytic copper plating is performed and a lower conductive layer 3 of approximately 5 micrometers is formed (FIG. 1B) on the surface of the electrode layer. Formation of the electrode layer may be made by performing a catalytic process and non-electrolytic copper plating after processing the insulating layer surface with a permanganate liquid to roughen it.

Figure 1C:
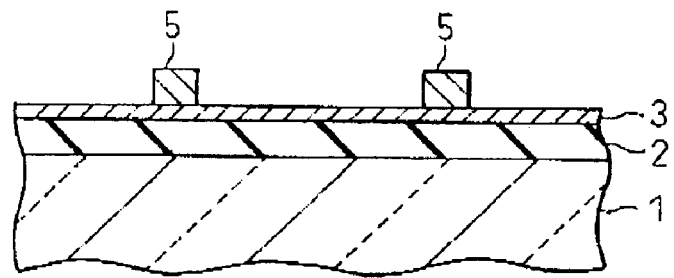

Next, the surface of the lower conductive layer 3 is coated with a resist to a thickness of approximately 10 micrometers, covered with a glass mask, and exposed to a 400 mJ/cm$^2$ mercury lamp, then the exposed portion is dissolved and removed using a developer that includes an alkali to form openings. Thereafter, electrolytic copper plating is performed to form side wall lower sections 5 of approximately 5 micrometers thickness on the surface of the lower conductive layer 3 exposed in the bottom portion of the opening, then the resist film is removed (FIG. 1C).

Figure 1D:
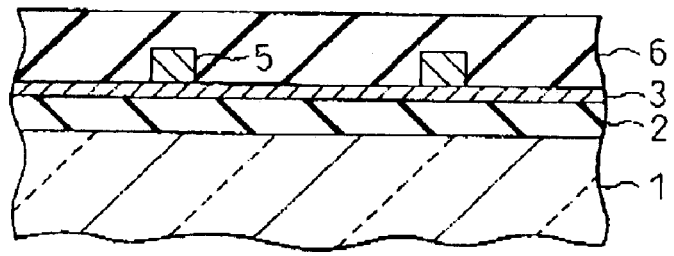
Figure 1E:
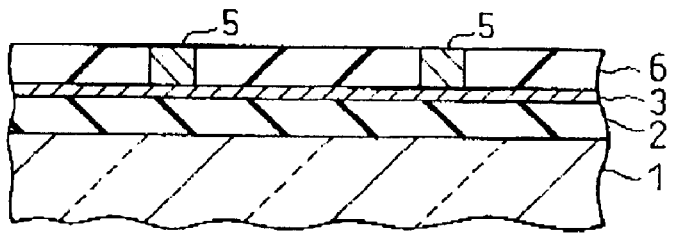

Then, using a spin coating method, the side wall lower sections 5 are coated with an insulative resin to approximately 10 micrometers so as to cover the side wall lower sections 5, and drying is performed at 80° C. for 30 minutes. This is then heated at 350° C. for 30 minutes to harden the resin and form an insulating layer 6 (FIG. 1D). Subsequently, part of the insulating layer 6 is removed by CMP (chemical mechanical polishing), exposing the upper portions of the side wall lower sections 5 as shown in FIG. 1E.

Figure 1F:
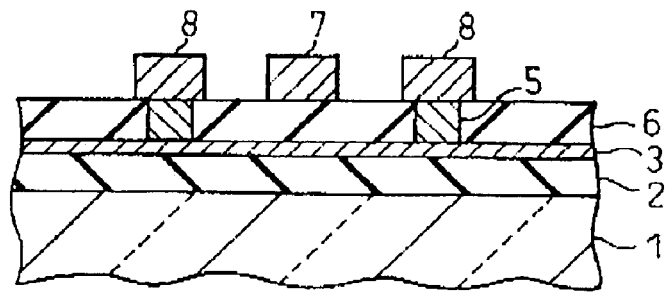

Next, an electrode layer (not shown) for performing electrolytic copper plating is formed by a sputtering method on the exposed upper surfaces of the side wall lower sections 5 and the remaining surface of the insulating layer 6. The surface of this electrode layer is coated with a resist of approximately 10 micrometeres thickness, covered with a glass mask, and exposed to a 400 mJ/cm$^2$ mercury lamp, then the exposed portion is dissolved and removed using a developer that includes an alkali to form exposed electrode layer openings above the side wall lower sections 5 and in a position between two side wall lower sections 5. Thereafter, electrolytic copper plating is performed to form an inner conductive member 7 and side wall central sections 8 to a thickness of 5 micrometers, then the resist film is removed (FIG. 1F).

Figure 1G:
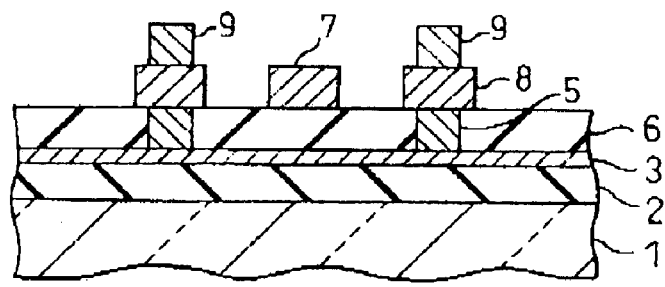

Then, the electrode layer, inner conductive member 7 and side wall central sections 8 are covered by a resist coating of approximately 10 micrometers thickness, this is covered with a glass mask, and exposed to a 400 mJ/cm$^2$ mercury lamp, then the exposed portion is dissolved and removed using a developer that includes an alkali to form exposed electrode layer openings on the upper surfaces of the side wall central sections 8. Electrolytic copper plating is then performed to form side wall upper sections 9 of approximately 5 micrometers thickness on the upper surfaces of the side wall central sections 8, the resist is removed, then the electrode layer exposed thereby is removed (FIG. 1G).

Figure 1H:
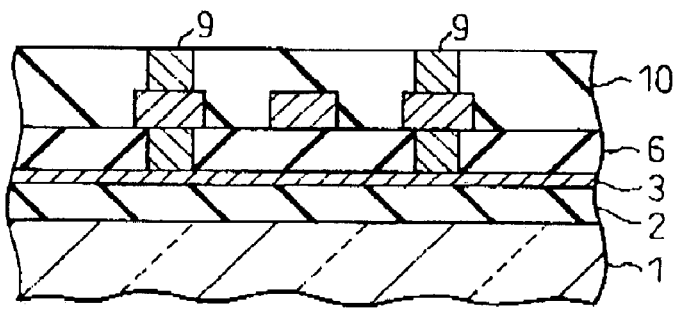

Subsequently, the insulating layer 6 is coated with an insulative resin to approximately 10 micrometers thickness using a spin coating method so as to cover the inner conductive member 7, side wall central sections 8, and side wall upper sections 9 thereon, then this is dried at 80° C. for 30 minutes. Thereafter, this is heated at 350° C. for 30 minutes to harden the resin and form an insulating layer 10, and part of the insulating layer 10 is removed by CMP to expose the upper surfaces of the side wall upper sections 9 as shown in FIG. 1H.

Figure 1I:
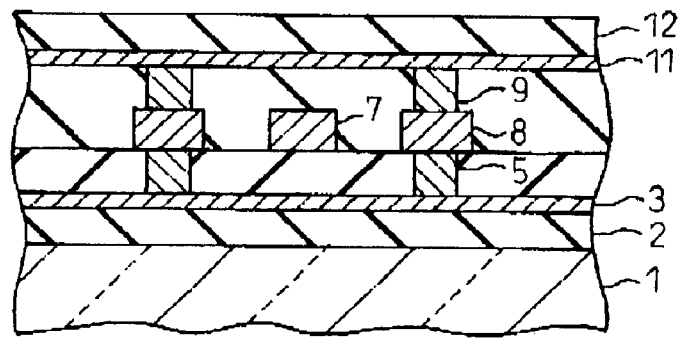

Next, an electrode layer (not shown) for performing electrolytic copper plating is formed by a sputtering method on the exposed side wall upper sections 9 and the remaining surface of the insulating layer 10. After this, electrolytic copper plating is performed to form an upper conductive layer 11 of approximately 5 micrometers thickness, then an insulating layer 12 is formed thereon (FIG. 1I).

Although the lower and upper conductive layers 3 and 11 of the thin film multi-layer wiring substrate illustrated in FIG. 1 are not patterned, it is possible to perform patterning thereon and separate each peripheral conductive layer around the coaxial structure wiring from the other peripheral conductive layer where necessary.

In this way, a substrate including coaxial structure wiring whose periphery is surrounded by an insulating material can be attained. On the surface of the insulating layer 12, a separate wiring layer is normally formed, and the inner conductive member 7 of the coaxial structure passes through the opening portion provided in the upper conductive layer 11 to connect to another wiring on the insulating film 12 by means of a via. This opening portion can be easily formed by patterning the upper conductive layer 11 after its formation, and the via passing therethrough can be easily formed using the method described above or the like. Alternatively, the inner conductive member 7 can be connected to other parts through a bump on a pad provided at the end of the via.

Figure 2:
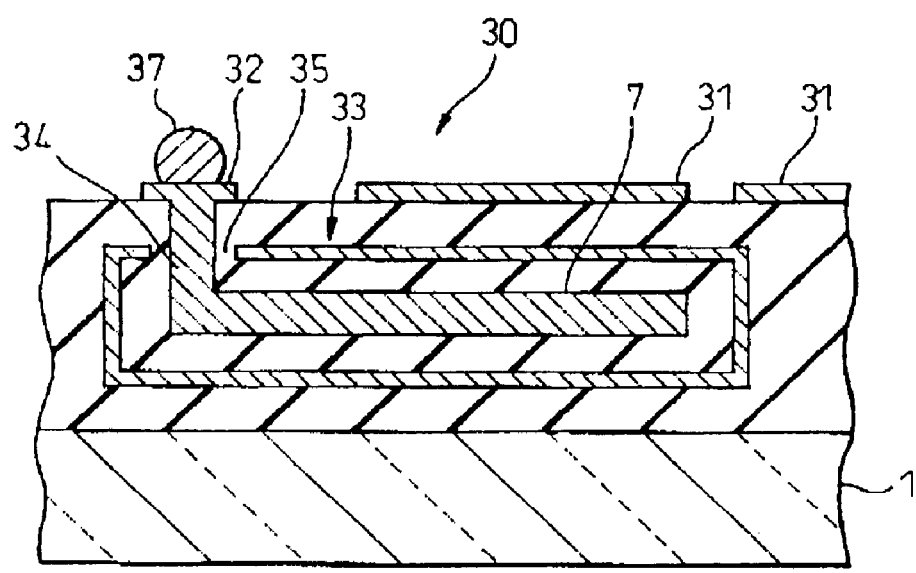
FIG. 2 is a sectional view illustrating one embodiment of the thin film multi-layer wiring substrate of the present invention.

FIG. 2 shows a typical sectional view of a thin film multi-layer wiring substrate 30 of this type of structure. In this drawing, the same members as are illustrated in FIG. 1 are represented by the same reference numbers. Wiring 31 and a pad 32 are provided on the surface of the thin film multi-layer wiring substrate 30, a bump 37 is positioned on the pad 32, and a via 34 extracted from the inner conductive member 7 of the coaxial structure wiring layer passes through the opening portion 35 provided in the outer conductive layer 33 to connect to the pad 32.

The rigid material Pyrex glass base 1 shown in FIG. 2 can be removed to attain a flexible thin film multi-layer wiring substrate such as, for example, a TAB tape. In order to separate the thin film multi-layer wiring substrate 30 shown in FIG. 2 from the base 1, a method such as the following, for example, can be used.

Figure 3A:
FIGS. 3A to 3D illustrate an example of the substrate peeling method utilized in the production of the thin film multi-layer wiring substrate of the present invention.
Figure 3B:
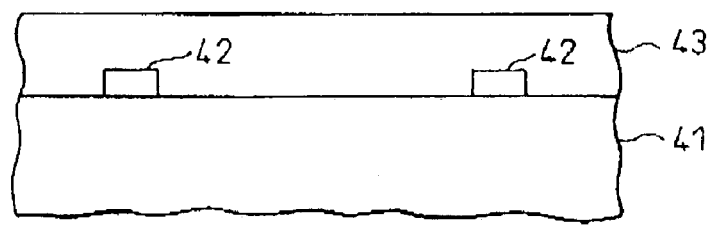
Figure 3C:
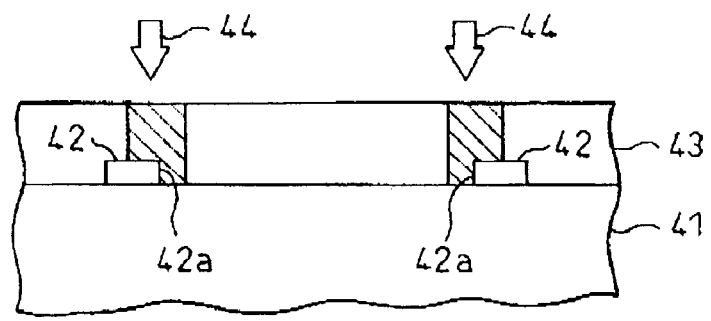
Figure 3D:
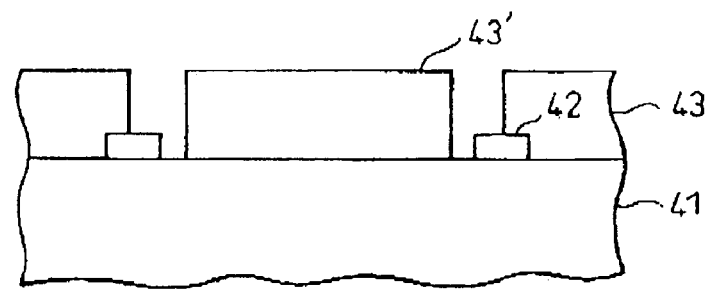

Firstly, as shown in FIG. 3A, patterned chrome films 42 are formed by a lift-off method, for example, on parts of the surface of the glass base 41. Next, a thin film multi-layer wiring structure 43 of the structure described above is formed (FIG. 3B). Then, as shown in FIG. 3C, the thin film multi-layer wiring structure 43 in regions in the vicinity of the opposing side walls 42a of the two chrome films 42 is irradiated by a YAG laser beam 44 to remove the thin film multi-layer structure from these regions, and the thin film multi-layer wiring structure 43' which is not-above the chrome layers 42 is separated from the other portions thereof (FIG. 3D). As this thin film multi-layer wiring structure 43' does not have a chrome film at its interface with the glass base 41, it can be easily peeled off from the base 41, and the peeled off structure 43' can be used as a flexible thin film multi-layer wiring substrate independent from the base 41.

Figure 4:
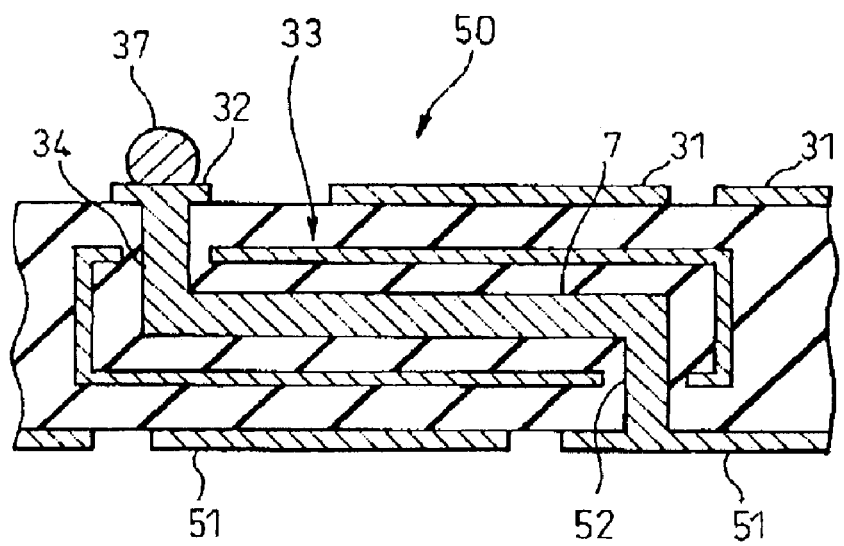
FIG. 4 is a sectional view illustrating another embodiment of the thin film multi-layer wiring substrate of the present invention.

The flexible thin film multi-layer wiring substrate independent from the base 41 is shown in FIG. 4, which is a similar typical sectional view to FIG. 2. In this drawing, the same members as those illustrated in FIG. 2 are represented by the same reference numbers. As well as the wiring 31 and pad 32 formed on the upper surface of the thin film multi-layer wiring substrate 50, wiring 51 is also formed on the lower surface, and a via 52 extracted from the coaxial structure wiring inner conductive member 7 is connected to the one of the wirings 51. Although not shown in this drawing, a pad and bump for connecting to other parts can be provided in the lower surface similarly to the upper surface, and a via 52 connected to this pad.

With the method of the present invention, because the coaxial structure wiring inner conductive member and the lateral portions of the conductive layer on either side thereof can be formed by only a thin film method applied to the formation of minutely detailed patterns, without using a thick film method, the width of the inner conductive member is on the order of, for example, 5 micrometers, and the gaps between the inner conductive member and the lateral portions of the conductive layer is also on the order of 5 micrometers for example, minute coaxial structure wiring that is advantageous for high integration can be produced.

By forming an insulating layer on the wiring 31 on the upper surface of the thin film multi-layer wiring substrate 30 of FIG. 2, and a separate wiring layer is provided thereon, a further multi-layered substrate is possible, in which case the pad 32 connected to the bump 37 is provided on the uppermost wiring layer. Similarly, insulating layers and wiring layers can be further laminated on the upper surface, lower surface, or both surfaces of the thin film multi-layer wiring substrate shown in FIG. 4, to produce a further multi-layered substrate.

In a further multi-layered thin film multi-layer wiring substrate of this type, the coaxial wiring can exist in only one wiring layer, or in a plurality of wiring layers. Similarly, a combination of coaxial wiring and normal wiring with no external conductor in one wiring layer is also possible. The normal wiring in this case can be formed at the same time as formation of the inner conductive member.

In the thin film multi-layer wiring substrates 30 and 50 shown in FIGS. 2 and 4, the inner conductive member 7 is completely surrounded by the outer conductive layer except for the through portions of the via 34 and 52. With the thin film multi-layer wiring substrate of the present invention, unless a hindrance to transmission of a high frequency signal, in particular, occurs, it can use a coaxial wiring structure with a discontinuous outer conductive layer, or without the ends thereof (the left and right vertical portions of the outer conductive layer shown in FIGS. 2 and 4) closed.

Also, in the structure of the thin film multi-layer wiring substrate explained with reference to FIG. 1, although only one inner conductive member, which is the signal transmission member, is formed with respect to one coaxial structure wiring, a plurality (normally two) inner conductive members can be formed.

Figure 5:
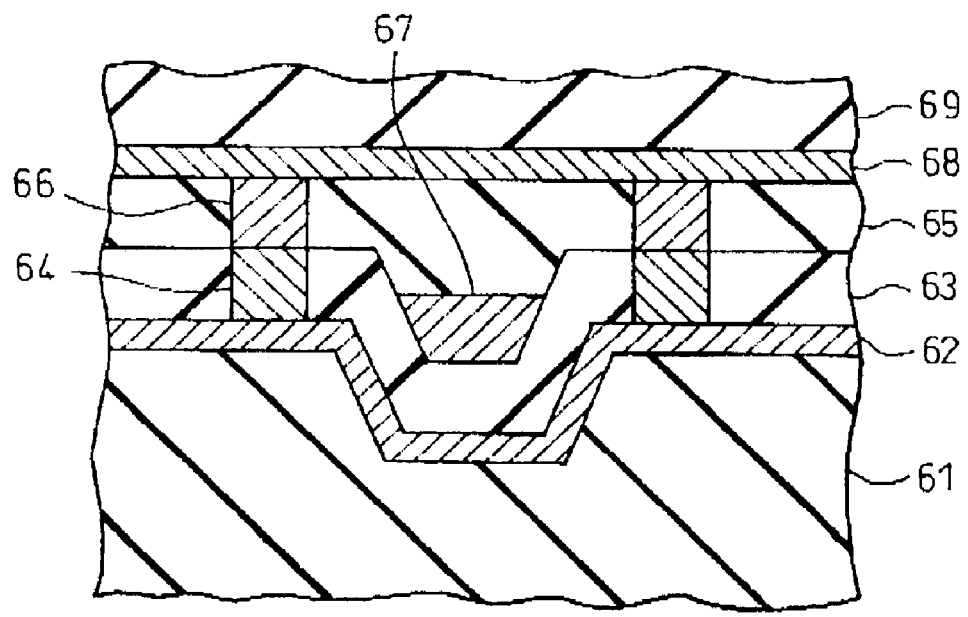
FIG. 5 is a sectional view illustrating a further embodiment of the thin film multi-layer wiring substrate of the present invention.

Further, in the thin film multi-layer wiring substrate according to the present invention, not only the rectangular cross-section outer conductive layer as described above, but a coaxial wiring provided with an outer conductive layer of another cross-sectional shape can be used. An example of one such is shown in FIG. 5. In this example, a lower portion 62 of a conductive layer is positioned to cover a lower insulating layer 61 that forms a trapezoid cross-section groove, and side wall lower sections 64 of the conductive layer are formed in an insulating layer 63 thereabove. Another insulating layer 65 is positioned on the insulating layer 63, side wall upper sections 66 of the conductive layer are formed in this insulating layer 65, and an inner wiring member 67 is arranged in a trapezoid cross-section groove between the two side wall upper sections 66, this inner wiring member 67 being formed simultaneously with the formation of the side wall upper sections 66. In this way, in the case of this embodiment, formation of the side wall central sections in the coaxial wiring of the thin film multi-layer wiring substrate of the embodiment provided with the rectangular cross-section outer conductive layer explained above can be omitted. The upper surface of the insulating layer 65 can be a flat surface with the upper surface of the side wall upper sections 66 exposed, with the upper portion 68 of the conductive layer and the upper insulating layer 69 formed sequentially thereon. Also, the cross-sectional shape of the groove of the lower insulating layer need not be trapezoid, but can be rectangular.

As explained above, the thin film multi-layer wiring substrate of the present invention can have a minutely detailed coaxial wiring structure with a signal transmission member whose width is, for example, 5 micrometers, the gaps between the signal transmission member and the side walls on either side thereof being 5 micrometers. Consequently, according to the present invention, a high density thin film multi-layer wiring substrate suitable for high frequency signal transmission in particular can be provided.

Next, the printed circuit board according to the present invention will be described with reference to the drawings.

Figure 6A:
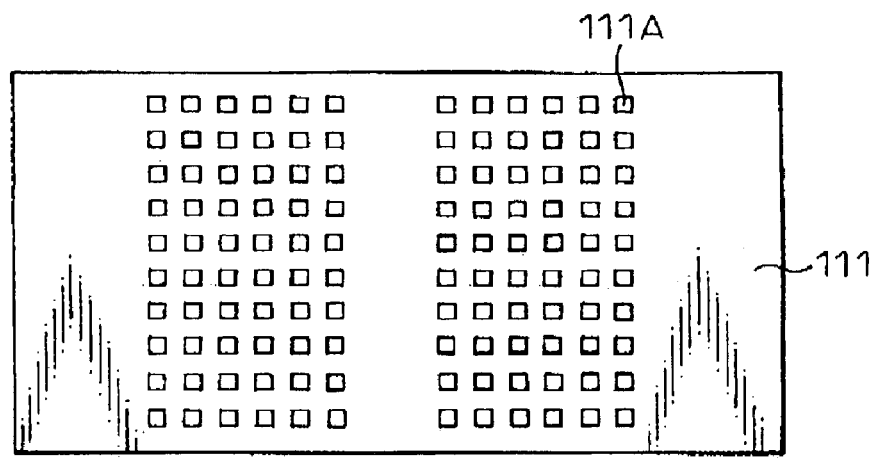
FIG. 6A is a plan view illustrating the printed circuit board of the present invention.
Figure 6B:
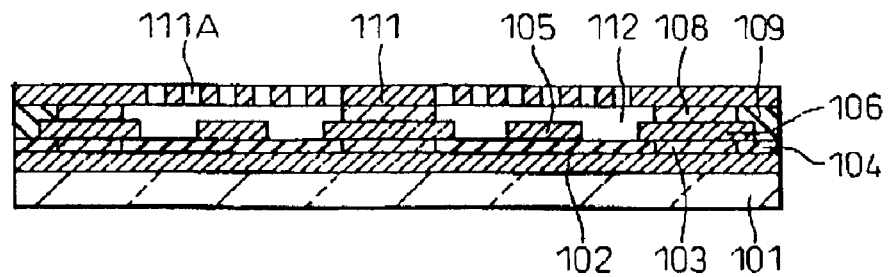
FIG. 6B is a sectional view illustrating the printed circuit board of the present invention.

FIGS. 6A and 6B show the printed circuit board according to an embodiment of the present invention, presenting a plan view and sectional view respectively. In the drawings, 101 represents a substrate, 102 represents a first ground layer, 103 represents first shield walls, 104 represents a first insulating layer, 105 represents a signal line conductor, 106 represents second shield walls, 108 represents third shield walls, 109 represents a second insulating layer, 111 represents a second ground layer, and 111A represents an opening.

FIGS. 7A to 7K illustrate the process of producing the printed circuit board of the present invention, the same reference numbers as those used in FIGS. 6A and 6B representing the same parts or having the same meaning.

Figure 7A:
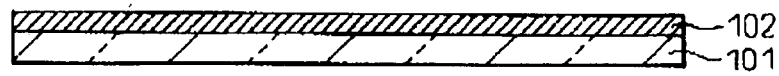
FIGS. 7A to 7K illustrate the process for producing the printed circuit board of the present invention.

As shown in FIG. 7A, a seed layer of Cr/Cu for subsequently performing electrolytic copper plating is formed on the surface of a substrate 101 made of phosphosilicate glass (PSG) by applying a sputtering method. As the thickness of this seed layer is extremely thin at 0.08 micrometer/0.8 micrometer, it is not shown in the drawing. Subsequently, by applying an electrolytic plating method, a first ground layer 102 of copper is formed on the surface of the seed layer to a thickness of 5 micrometer.

Figure 7B:

A resist film is formed to a thickness of 10 micrometers on the first ground layer 102 by applying lithographic resist processing. This is exposed to a 400 $mJ/cm^2$ mercury lamp, via a glass mask with a required mask pattern, and then the exposed regions are dissolved and removed using an alkaline developer to pattern the resist film. Next, first shield walls 103 are formed from copper to a thickness of 5 micrometers on the surface of the first ground layer 102 by applying the electrolytic plating method as shown in FIG. 7B.

Figure 7C:
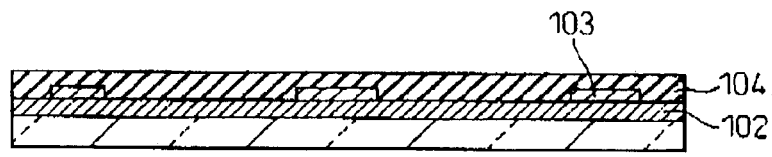

The entire surfaces of the first shield walls 103 and first ground layer 102 are coated by a non-photosensitive polyimide (PI) by applying the spin coating method to form a resin insulating layer of 10 micrometers thickness. This is dried at a temperature of 80° C. for 30 minutes, then heated to a temperature of 350° C. for 30 minutes to harden the resin insulating layer and form a first insulating layer 104 (FIG. 7C).

Figure 7D:
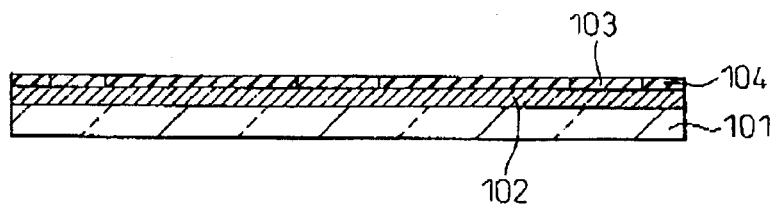

As shown in FIG. 7D, the first insulating layer 104 is polished, by applying a chemical mechanical polishing (CMP) method, thus exposing the surfaces of the first shield walls 103.

Figure 7E:
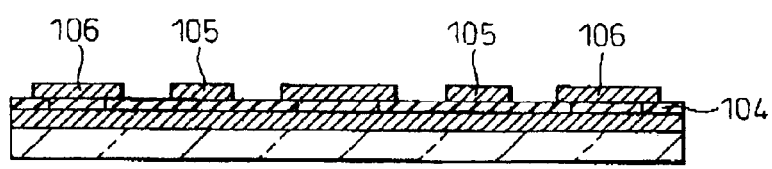

A seed layer (not shown) is formed by applying the sputtering method on the entire surface including the surface of the first insulating layer 104 from Cr/Cu for performing electrolytic plating. Then, by applying a lithographic resist process, a resist film is formed to a thickness of 10 micrometers on the entire surface. The resist film is exposed to a 400 mJ/cm$^2$ mercury lamp, via a glass mask with a required mask pattern, and then the exposed regions are dissolved and removed using an alkaline developer to form openings above the first shield walls 103 and in a portion intended to form a signal line conductor. Copper plating to a thickness of 5 micrometers is performed by applying the electrolytic plating method in openings above the first shield walls 103 and the opening intended for the signal line conductor on the first insulating layer 104, the resist film is removed, and the second shield walls 106 and signal line conductor 105 are formed (FIG. 7E).

Figure 7F:
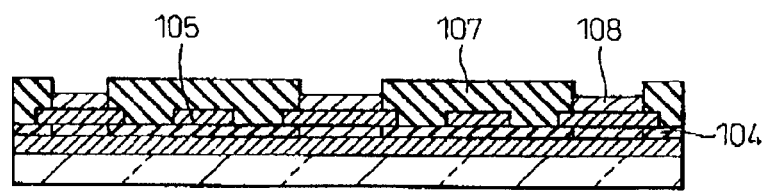

As shown in FIG. 7F, by applying a lithographic resist process, a resist film 107 (sacrifice film) is formed to a thickness of 10 micrometers on the entire surface, The resist film 107 is exposed to a 400 mJ/cm$^2$ mercury lamp, via a glass mask with a required mask pattern, and then the exposed regions are dissolved and removed using an alkaline developer to form openings above the second shield walls 106. Next, copper plating to a thickness of 5 micrometers is performed by applying the electrolytic plating method in the openings above the second shield walls 106 to form third shield walls 108 (FIG. 7F).

Figure 7G:
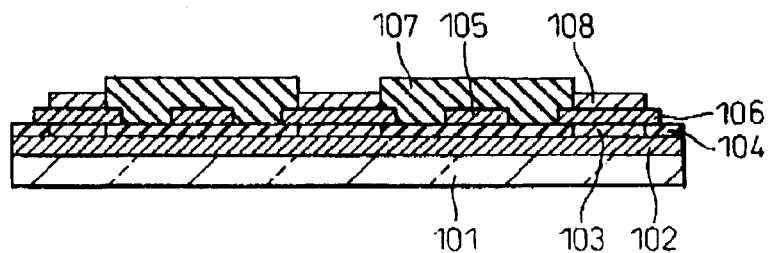

The resist film 107 is exposed using a 400 mJ/cm$^2$ mercury lamp via a glass mask with a required mask pattern, then the exposed regions are dissolved and removed using an alkaline developer, then the resist film 107 between the first, second and third laminated shield walls and covering regions where the signal line conductor 105 does not exist is removed to form open spaces (FIG. 7G).

Figure 7H:
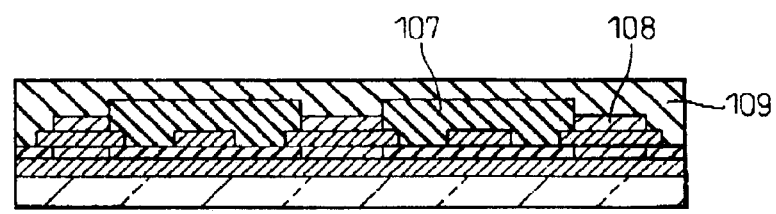

The entire surface is coated with a non-photosensitive PI by applying the spin coating method to form a resin Insulating layer of 10 micrometers thickness. This is dried at a temperature of 80° C. for 30 minutes, then heated at a temperature of 350° C. for 30 minutes to harden the resin insulating layer and form a second insulating layer 109 (FIG. 7H).

Figure 7I:
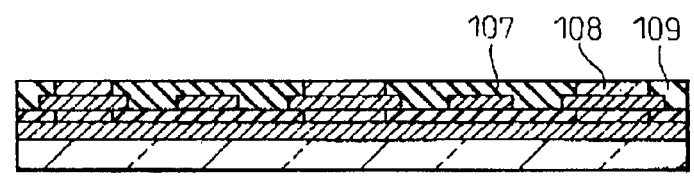

As shown in FIG. 7I, the resist film 107 and second insulating layer 109 are polished by applying the CMP method, exposing the surfaces of the third shield walls 108 and flattening the entire surface.

Figure 7J:
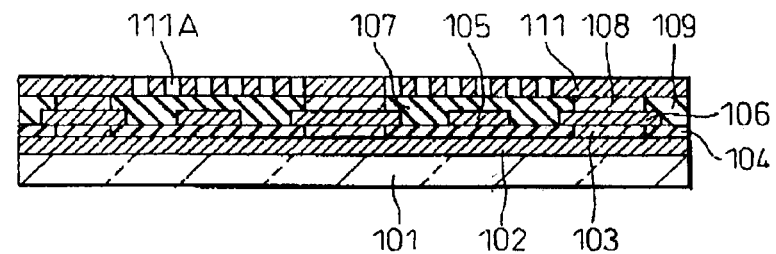
Figure 7K:
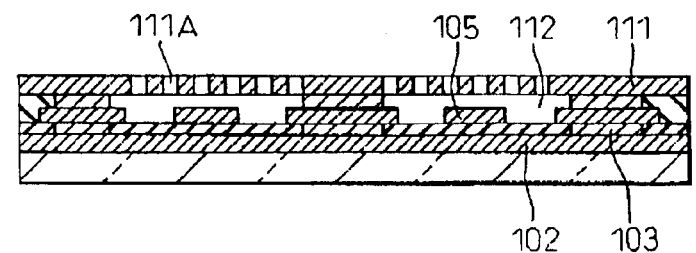

A seed layer (not shown) for performing electrolytic plating on the entire surface is formed from Cr/Cu by applying a sputtering method. Then, a second ground layer 111 of copper is formed on the seed layer to a thickness of 5 micrometers by applying an electrolytic plating method (FIG. 7J). Then, by applying a lithographic resist process and a wet etching method with an aqueous solution of ammonium persulphate as the etchant, the second ground layer 111 is selectively etched at regions between the shield walls and where the signal line conductor exists, in other words, above regions where the resist film 107 exists, to form a plurality of openings 111A (FIG. 7J).

By dipping the substrate 101 in a resist peeling solution and introducing the resist peeling solution from the openings 111A, the resist film 107, in other words the sacrifice film, is removed, whereby cavities 112 (FIG. 7K) are produced.

In the printed circuit board produced in this way, it can be understood that the signal line conductor 105 is covered by air (a dielectric) at its upper surface and both side surfaces, and the structure surrounding the first ground layer 102, laminated shield walls comprising first shield walls 103, second shield walls 106 and third shield walls 108, and second ground layer 111, that is, a coaxial structure, is formed.

As the metal material used in the present invention, other than copper, all metals normally used in semiconductor devices, such as gold, aluminum, and the like can be used, and as the insulating material, many types of materials such as epoxy resin, polyimide resin, polybenzooxazole resin, benzo-cyclobutene resin, and the like can be used.

According to the printed circuit board and manufacturing method of the present invention, a printed circuit board comprising a signal line conductor formed on a first insulating layer selectively covering the first ground layer which spreads across the substrate, shield walls that spread across the gaps on either side of the signal line conductor and conductively connect to the first ground layer, and a second ground layer that has a plurality of openings that conductively connect to the shield walls, stretch across gaps above the signal line conductor, and have lengths and distances therebetween equal to or less than one quarter of the frequency handled by the signal line conductor, is realized.

In this way, according to the present invention, cavities can be formed around the signal line conductor, and the realization of this allows openings in the second ground layer having lengths and distances therebetween equal to or less than one quarter of the wave length to be formed and, therefore, the impedance of the signal line conductor can be reduced, interference due to electromagnetic induction between signal lines prevented, sufficient functionality in reducing electrostatic induction noise from outside realized, and deterioration of the high frequency characteristic suppressed and, in addition, because the above coaxial structure allows convenient production by applying the prior art processing technique for producing thin film multi-layer wiring substrates, it can be made to correspond easily to existing techniques.

What is claimed is:

1. A thin film multi-layer wiring substrate comprising a plurality of wiring layers, each adjacent pair of wiring layers being separated by an insulating layer, wherein at least one of the wiring layers includes wiring formed by an inner conductive member and a conductive layer surrounding the periphery of said inner conductive member on all sides through an insulating material.

2. The thin film multi-layer wiring substrate according to claim 1, wherein one or a plurality of inner conductive members are surrounded by one conductive layer through the insulating material.

3. The thin film multi-layer wiring substrate according to claim 2, wherein one or a plurality of wiring layers include the wiring formed by the inner conductive member and the conductive layer surrounding the periphery thereof through the insulating material.

4. The thin film multi-layer wiring substrate according to claim 3, wherein wiring formed by the inner conductive member and the conductive layer surrounding the periphery thereof through the insulating material, and wiring not surrounded by the conductive layers exist in the wiring layer or layers.

5. The thin film multi-layer wiring substrate according to claim 1, wherein a material of the inner conductive member and the conductive layer surrounding the periphery thereof through the insulating material is one of copper, a copper alloy, aluminum, and an aluminum alloy.

6. The thin film multi-layer wiring substrate according to claim 1, wherein a material of the insulating layers is one of epoxy resin, polyimide resin, polybenzooxazole resin, and benzo-cyclobutene resin.

7. The thin film multi-layer wiring substrate according to claim 1, which includes a rigid base on which a laminated structure of the insulating layers and the wiring layers is arranged.

* * * * *